(12) United States Patent
Larsen

(10) Patent No.: US 7,895,847 B2
(45) Date of Patent: Mar. 1, 2011

(54) WIND ENERGY CONVERTER WITH DEHUMIDIFIER

(75) Inventor: Gerner Larsen, Hinnerup (DK)

(73) Assignee: Vestas Wind Systems A/S (DK)

( * ) Notice: Subject to any disclaimer, the term of this patent is extended or adjusted under 35 U.S.C. 154(b) by 0 days.

(21) Appl. No.: 12/533,860

(22) Filed: Jul. 31, 2009

(65) Prior Publication Data

US 2009/0289461 A1    Nov. 26, 2009

Related U.S. Application Data

(63) Continuation of application No. PCT/DK2008/000024, filed on Jan. 23, 2008.

(30) Foreign Application Priority Data

Jan. 31, 2007    (DK) .............................. 2007 00158

(51) Int. Cl.
*F25D 17/06*    (2006.01)

(52) U.S. Cl. ........................................... 62/93; 62/236

(58) Field of Classification Search ................. 62/236, 62/260, 238.7, 238.6, 285, 428, 93, 176.1; 60/515, 641; 290/55; 417/334; 126/247; 165/45, 60, 104.19; 310/56
See application file for complete search history.

(56) References Cited

U.S. PATENT DOCUMENTS

| | | | | | |
|---|---|---|---|---|---|
| 3,752,395 | A | * | 8/1973 | Ashikian | ..................... 237/46 |
| 4,143,522 | A | * | 3/1979 | Hamrick et al. | ............ 62/324.1 |
| 4,735,054 | A | * | 4/1988 | Beckey | ........................... 62/93 |
| 5,575,835 | A | | 11/1996 | Bailey et al. | |
| 5,857,344 | A | * | 1/1999 | Rosenthal | ....................... 62/93 |
| 6,676,122 | B1 | | 1/2004 | Wobben | |
| 6,774,504 | B1 | | 8/2004 | Lagerwey | |
| 7,168,251 | B1 | * | 1/2007 | Janssen | ..................... 60/641.1 |
| 2005/0002787 | A1 | | 1/2005 | Wobben | |
| 2005/0082836 | A1 | | 4/2005 | Lagerwey | |
| 2006/0137214 | A1 | | 6/2006 | Achenbach | |
| 2006/0145484 | A1 | | 7/2006 | Kruger-Gotzmann et al. | |

FOREIGN PATENT DOCUMENTS

| | | |
|---|---|---|
| DE | 4423851 A1 | 8/1995 |
| DE | 10016913 A1 | 10/2001 |
| DE | 102005025944 A1 | 12/2006 |

(Continued)

OTHER PUBLICATIONS

Danish Search Report; PA 2007 00158; Sep. 30, 2007; 1 page.

(Continued)

*Primary Examiner*—Mohammad M Ali
(74) *Attorney, Agent, or Firm*—St. Onge Steward Johnston & Reens LLC

(57) ABSTRACT

A wind energy converter includes a wind turbine and a climate control mechanism operable as a dehumidifying mechanism for separating and removing humidity from air within one or more areas of the wind turbine. The climate control mechanism includes at least one cooling device for condensing humidity as well as at least one drain device for draining condensed water from the one or more areas being dehumidified. The wind energy converter includes a cooling flow mechanism for providing a flow of a cooling liquid to the at least one cooling device, thereby providing a heat sink for the cooling device.

29 Claims, 8 Drawing Sheets

FOREIGN PATENT DOCUMENTS

| | | |
|---|---|---|
| EP | 1736665 A2 | 12/2006 |
| JP | 7280293 A | 10/1995 |
| JP | 10118442 A | 5/1998 |
| JP | 10165746 A | 6/1998 |
| WO | 0121956 A1 | 3/2001 |
| WO | 03014629 A1 | 2/2003 |
| WO | 2004029450 A1 | 4/2004 |

OTHER PUBLICATIONS

International Search Report and Written Opinion of the International Searching Authority; PCT/DK2008/000024; Nov. 13, 2008; 14 pages.

* cited by examiner

WIND ENERGY CONVERTER WITH DEHUMIDIFIER

CROSS-REFERENCE TO RELATED APPLICATIONS

The present application is a continuation of pending International patent application PCT/DK2008/000024 filed on Jan. 23, 2008 which designates the United States and claims priority from Danish patent application PA 2007 00158 filed on Jan. 31, 2007, the content of which is incorporated herein by reference.

FIELD OF THE INVENTION

The invention relates to dehumidification of one or more areas of a wind energy converter comprising a wind turbine.

BACKGROUND OF THE INVENTION

When a wind energy converter has been standing still for a period, it can be very cold and humid inside. Especially, if the wind energy converter is positioned in a place with high day-time temperatures and low night-time temperatures, condensation of the humidity in the air when it is being cooled down can make all surfaces inside the wind energy converter very wet. This is a normal situation if the wind energy converter is not running during the night time due to lack of wind. Also, in locations with high environmental humidity such as near-shore or off-shore locations condensed water is very often found on the different surfaces inside the wind energy converter.

In order to avoid electrical short circuits when starting up the wind energy converter, it is essential to make sure that the surfaces of circuit boards and other critical elements within the wind turbine are dry before the power electronics are switched on. Dehumidification is also important in order to avoid corrosion of the contact surfaces of switches as well as different structural parts of the wind energy converter, especially those parts made of iron and aluminum which are some of the most vulnerable materials normally used.

A method for dehumidification disclosed in the international patent application WO 03/014629 A1 uses an electrical Peltier element to cool down the surfaces of a cooling unit to a temperature low enough to make sure that the humidity in the air condenses on the surfaces where after it can be drained away.

The object of the present invention is to provide means and methods for improved dehumidification one or more areas of a wind energy converter compared with previously known means and methods.

SUMMARY OF THE INVENTION

With the present invention is provided a wind energy converter with means for efficiently removing humidity from moisture-sensitive areas of the wind energy converter, in particular during a start-up procedure where the wind energy converter is being prepared for renewed operation after a period of stand-still, such as during a night period of low wind speed. By providing a flow of a cooling liquid to a cooling device of a climate control means of the wind energy converter, a heat sink with a large capacity for removing the heat that is released by the condensation of the humidity of the air inside the areas being dehumidified is provided, whereby larger amounts of moisture may be efficiently removed.

A number of advantageous embodiments of the present invention are disclosed and discussed below.

Thus, the present invention relates to a wind energy converter comprising a wind turbine and climate control means operable as dehumidifying means for separating and removing humidity from air within one or more areas of said wind turbine, the climate control means comprising at least one cooling device for condensing humidity as well as at least one drain device for draining condensed water from said one or more areas being dehumidified, and the wind energy converter comprises cooling flow means for providing a flow of a cooling liquid to the at least one cooling device, thereby providing a heat sink for said cooling device.

By removing the moisture from the one or more areas, short-circuit of electrical parts, such as the generator, power switches of a power converter for converting the frequency of electrical power to be fed to the consumer grid or to the rotor of a double fed generator, a transformer etc. may be prevented and the durability of a number of components, such as power switches, may be improved. Also, corrosion of constructive parts, such as steel parts which are very sensitive to moisture may be prevented, but also corrosion of other metal parts of e.g. aluminum, which is very sensitive to the saline environment at near-shore and off-shore positions of wind turbines may be prevented. By preventing corrosion by means of dehumidifying the areas, other means of corrosion-inhibiting measures, such as zinc plating may be avoided, which facilitates later recycling of the parts of the wind energy converter.

Thus, the dehumidification may be applied preferably to areas containing the power electronics for power converters, areas around the generator, in particularly in case a multi-pole generator is utilized in the wind turbine, but also for dehumidifying structural parts of the wind energy converter in order to prevent corrosion.

According to one preferred embodiment of the invention, the climate control means comprises one or more closed circuits for circulating cooling liquid through or past the cooling device and means for cooling said cooling liquid.

By providing a closed circuit for the cooling liquid applied directly to the cooling device, the quality of such liquid is controllable and e.g. clogging of flow paths inside the cooling device, corrosion of fluid conduits, freezing of the cooling liquid inside fluid conduits etc. may be prevented. Preferred types of a cooling liquid in a closed circuit are an anti-freeze and water solution, methanol, isopropyl alcohol, propylene glycol, ammonia, $CO_2$, fluorocarbon refrigerants or potassium acetate.

By the term fluorocarbon refrigerants is understood the so-called Freon refrigerants: Chlorofluorocarbons (CFC), Hydrochlorofluorocarbons (HCFCs) and hydrofluorocarbons (HFCs).

The means for cooling the cooling liquid may preferably comprise a liquid-liquid heat exchanger arranged to employ a source of cooling water external to the wind energy converter, in particular ground water or sea water, to exchange heat with the cooling liquid.

Alternatively, the wind energy converter may comprise a wind turbine foundation, wherein said means for cooling the cooling liquid comprises a heat dissipation arrangement inside the wind turbine foundation and/or in the ground or seabed underneath the wind turbine foundation.

As another alternative, the wind energy converter may comprise a wind turbine foundation, wherein said means for cooling the cooling liquid comprises a heat dissipation arrangement in the ground or in the sea and/or seabed outside the wind turbine foundation.

The closed circuit for heat dissipation in or outside the foundation of the wind turbine may in one embodiment be connected directly to the cooling device of the climate control means, so that the same liquid flows in the heat dissipation arrangements and in or part the cooling device. Alternatively, two separate closed circuits are arranged with one closed circuit for the cooling device and another closed circuit for the heat dissipation arrangement and a heat exchanger there between.

In another preferred embodiment, the climate control means comprises one or more open circuits for providing said flow of cooling liquid, in particular where the circuit is arranged to employ a source of cooling water external to the wind energy converter as the cooling liquid such as ground water or sea water, which is then provided directly to the cooling device.

It is furthermore advantageous if the climate control means comprises at least one heating device for heating the air within said one or more areas of said wind turbine, so that the one or more areas to be dehumidified may be heated prior to the dehumidification, so that the air inside the areas may contain more water, and may absorb condensed water from surfaces of the area and transport it to the climate control means operated as dehumidifying means where the humidity is removed by condensation. The heating means and the climate control means operated as dehumidifying means may be operated simultaneously or alternately, depending on the configuration of the implementation of the present invention.

It is advantageous that the wind energy converter comprises a heat storage and means for selectively transferring excess heat energy from one or more power transmission parts of the wind turbine, such as gear box, electrical converter, generator, transformer or power electronics, to said heat storage and storing said heat energy therein and for retrieving heat energy there from for subsequent use with said climate control means.

Alternatively, the heat for the heating means may be obtained from other sources, such as solar energy or geothermal energy.

The heat storage may be arranged inside the wind turbine foundation and/or in the ground or seabed underneath the wind turbine foundation. Alternatively, the heat storage may be arranged in the ground or seabed outside the wind turbine foundation.

In a preferred embodiment of the present invention, the climate control means comprises at least one physical element configured to be operable as the heating device as well as the cooling device, thereby saving space inside the area or areas to be dehumidified as well as being cost-efficient. In particular, the heating device may comprise means for being heated by a heating fluid circulating in one or more closed circuits through or past the heating device.

It is preferred that the climate control means comprises a common flow path within said climate control means for selectively allowing said flow of a cooling liquid and said flow of a heating fluid to exchange heat with the air within said one or more areas of the wind turbine.

In a particular embodiment of the present invention, the cooling device comprises a closed cooling circuit of a cooling agent, the circuit comprising an evaporator arranged for evaporating the cooling agent by thermal exchange with the air of said one or more areas of the wind turbine, pressurizing means for pressurizing the evaporated cooling agent and a condenser for condensing the pressurized cooling agent by thermal exchange with the cooling liquid. With such arrangement, the temperature of the part of the cooling device being in contact with the air of the area to be dehumidified may become lower that the temperature of the cooling liquid which allows for a more efficient condensation of humidity. Such cooling circuit is well-known from e.g. refrigerators etc. using cooling agents such as a HFC, HCFC or CFC, carbon dioxide or $NH_3$.

In a further embodiment, such closed cooling circuit is arranged for selectively amendment of the operation thereof to constitute a heating device for heating the air within said one or more areas of said wind turbine, wherein said evaporator operates as a condenser. Inverted operation of cooling circuits is well-known in the art for the purpose of defrosting of the evaporator, but in this case it is used to provide an efficient heating of the area in which the evaporator is located. The heat for evaporation may be provided from a heating fluid as described previously or from the surrounding air, or the heat may actually be provided by means of the cooling liquid, as such circuit may deliver heat at a temperature above the temperature of the evaporator.

It is advantageous that the wind energy converter comprises control means arranged to control the operation of the climate control means at start-up of the wind energy converter, during which operation the heating means are operated to heat said one or more areas of said wind turbine to a predefined operating temperature, and the climate control means are operated as dehumidifying means for separating and removing humidity from the air within said one or more areas of the wind turbine.

The wind energy converter may in particular comprise one or more humidity sensors arranged within said one or more areas of said wind turbine for detecting a measure of the humidity and providing an output accordingly to the control means, wherein the control means are arranged to operate the heating means and the climate control means operated as dehumidifying means in response to said output, e.g. until said output provided by the humidity sensor or sensors are within a predefined range.

The one or more humidity sensors may be arranged adjacent to one or more power switches of an electrical power converter for providing power of predefined frequency, and the one or more humidity sensors may in particular be arranged to measure the humidity of a moisture-absorbing material surrounding the one or more power switches. The power switches are highly sensitive to moisture, and an excessive level of humidity around the power switches may shorten the lifespan or duration of the power switches, such as IGBTs, dramatically.

The control means may in particular be arranged to alternately operate the heating means and the climate control means operated as dehumidifying means in repeated cycles, so that the areas may be efficiently dehumidified.

One or more parts of said climate control may be arranged anywhere in or around the wind energy converter, such as in the nacelle and/or the blades and/or the tower and/or the foundation of the wind turbine and/or anywhere else inside or immediately outside the wind energy converter.

It is advantageous that at least a part of the climate control means is configured to be operable as well as dehumidifying means as temperature control means, mainly for cooling the power transmission parts, i.e. gear box, generator, transformer and/or power converter etc., thereby saving space inside the area or areas to be dehumidified as well as being cost-efficient.

The present invention furthermore relates to a method for dehumidification of one or more areas of a wind energy converter in accordance with the wind energy converter as disclosed above.

According to a further aspect of the present invention, a wind energy converter is provided comprising a wind turbine, and climate control means including a heating device for controlling the climate within one or more areas of the wind turbine, wherein the wind energy converter comprises a heat storage and means for selectively transferring excess heat energy from one or more power transmission parts of the wind turbine to said heat storage and storing said heat energy therein and for retrieving heat energy there from for subsequent use with said climate control means. The heat storage may contain the features and embodiments discussed previously. The provision of such heat storage is advantageous in that the wind energy converter at start-up of operation where the temperatures of various parts of the converter are below ordinary operational temperature, may be heated quickly and without the need of external energy sources, which may be impossible to obtain for wind energy converters operating as stand-alone units, also known as islanding. Heating of power switches used in power converters before resuming operation after a stand-still may prolong the durability of the power switches, and preheating of the oil of a gear box is often a necessity for the gear box to be in an operational state.

The climate control means may in a preferred embodiment comprise at least one physical element configured to be operable as the heating device as well as the cooling device for cooling said one or more areas of the wind turbine as described previously.

According to a yet further aspect of the present invention, it relates to a method for maintaining wind energy converter parts dehumidified, wherein the method comprises the steps of providing a wind energy converter part comprising climate control means operable as dehumidifying means for separating and removing humidity from air within said wind energy converter part, the climate control means comprising at least one cooling device for condensing humidity as well as at least one drain device for draining condensed water from said part being dehumidified, operating the climate control means as dehumidifying means including providing a flow of a cooling liquid to the at least one cooling device, thereby providing a heat sink for said cooling device, during transportation of the wind energy converter part, and operating said climate control means after installation of said part in a wind energy converter for controlling the climate within said part during operation of the wind energy converter.

This is advantageous in order to avoid corrosion of the contact surfaces of the power switches and other electronic elements as well as corrosion of the structural parts of the wind energy converter parts in question, especially those parts made from iron and aluminum during transportation of the wind energy converter part. By installing the climate control means prior to transportation of the wind energy converter part and using the climate control means for dehumidification during the transportation, an efficient dehumidification is enabled without a requirement for temporary installation of dehumidifiers, which is cumbersome and involves a risk of damaging or polluting internal structures or components of the wind energy converter part in question. Alternatively, the temporary installed dehumidifiers during transportation are only acting on the exterior of the wind energy converter part which does not ensure a thorough and efficient dehumidification.

BRIEF DESCRIPTION OF THE DRAWINGS

The invention will be described in the following with reference to the figures in which.

The embodiments shown in the figures are examples provided to illustrate and support the understanding of the present invention and are not to be regarded as limiting of the scope of protection defined by the appended claims.

DETAILED DESCRIPTION OF THE INVENTION

Figure 1:
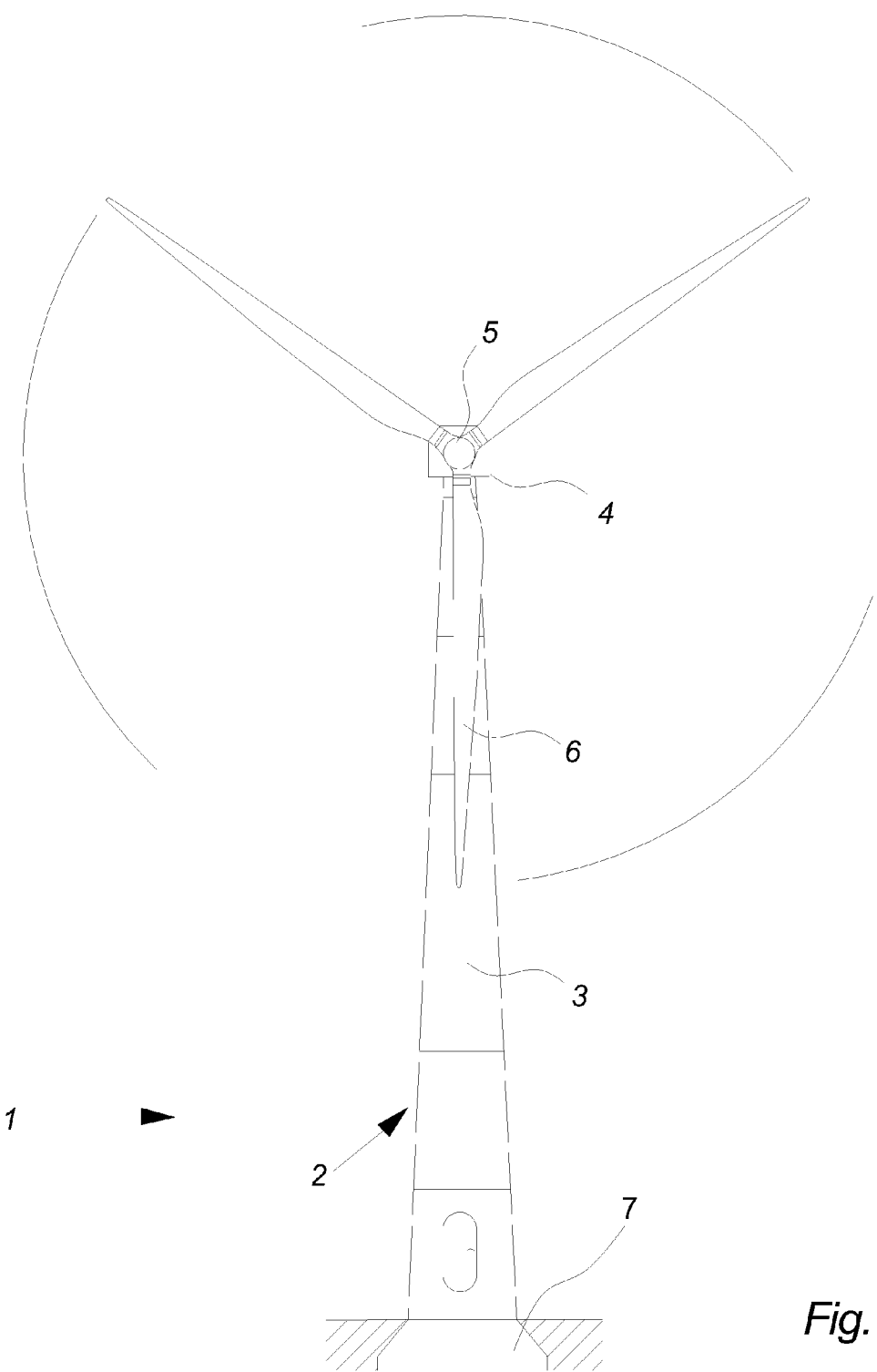
FIG. 1 illustrates a large modern wind energy converter known in the art, as seen from the front.

FIG. 1 illustrates a wind energy converter 1 comprising a modern wind turbine 2 placed on and rigidly connected to a wind turbine foundation 7. The wind turbine 2 comprises a tower 3 and a wind turbine nacelle 4 positioned on top of the tower 3. The wind turbine rotor 5, comprising three wind turbine blades 6, is connected to the nacelle 4 through the low speed shaft which extends out of the front of the nacelle 4.

Figure 2:
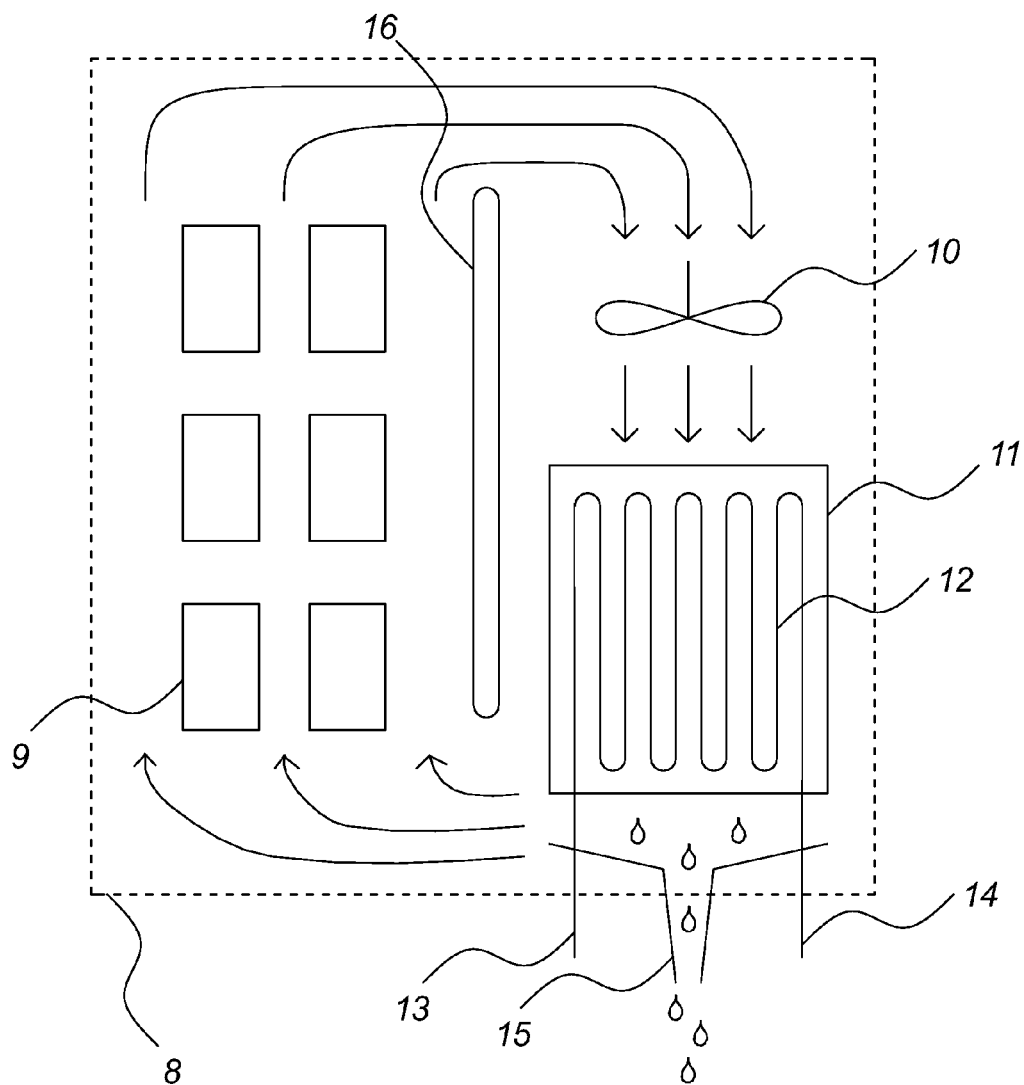
FIG. 2 illustrates a simplified switch cabinet for a wind turbine including a dehumidifying device.

FIG. 2 illustrates an embodiment of the invention, in which the climate control means is operated as dehumidifying means 10, 11, 12, 13, 14, 15, 16 for keeping the humidity in one or more areas of a wind energy converter 1 below a certain limit.

When a wind energy converter 1 has been standing still for a period, it can be very cold and humid inside. Especially, if the wind energy converter 1 is positioned in a place with high day-time temperatures and low night-time temperatures, condensation of the humidity in the air when it is being cooled down can make all surfaces inside the wind energy converter 1 very wet. This is a normal situation if the wind energy converter 1 is not running during the night time due to lack of wind. Also, in locations with high environmental humidity such as near-shore or off-shore locations condensed water is very often found on the different surfaces inside the wind energy converter 1.

In order to avoid electrical short circuits when starting up the wind energy converter 1, it is essential to make sure that the surfaces of circuit boards and other critical elements, in particular the power switches of the power converter within the wind turbine 2 are dry before the power electronics are switched on. Dehumidification is also important in order to avoid corrosion of the contact surfaces of switches as well as different structural parts of the wind energy converter 1, especially those parts made of iron and aluminum which are some of the most vulnerable materials normally used.

In this embodiment of the invention, a dry condition suitable for starting up the wind energy converter 1 can be achieved by performing consecutive steps of operating the heat exchanger 11 alternately as a heating device and a cooling device.

When the heat exchanger 11 is operated as a heating device, the fluid conduits 12 conduct a flow of a warm liquid which is provided to and drained from the heat exchanger 11 by the inlet 13 and outlet 14 for cooling/heating fluid, respectively.

The fan 10 and the flow guidance element 16 create a flow of air across the liquid-gas heat exchanger 11 bringing the air into thermal contact with the warm fluid conduits 12, thus heating the air and increasing its capacity for containing humidity. As the heated air passes different surfaces, the water on these surfaces will evaporate, thus increasing the amount of humidity within the air.

Next, when the heat exchanger 11 is operated as a cooling device, the fluid conduits 12 conduct a flow of a cold liquid which is provided to and drained from the heat exchanger 11 by the inlet 13 and outlet 14 for cooling/heating fluid, respectively.

Still, the fan 10 and the flow guidance element 16 create a flow of air across the liquid-gas heat exchanger 11 bringing the air into thermal contact with the now cold fluid conduits 12 having a temperature below the dew point of the air. The humidity in the air condenses to water on the surface of the fluid conduits 12, from where it drips off and is collected and drained away by the drain device 15.

In an alternative embodiment of the invention, the condensed water is actively blown off the surface of the fluid conduits 12 by increasing the velocity of the fan 10, where after the water is collected by a splash filter and drained away by a drain device 15.

The flow guidance element 16 is a passive structure the purpose if which is to make sure that the air within the area of the wind energy converter 1 in which the climate control means operates flows in an appropriate way for getting the maximum benefit from the invention. In other embodiments of the invention, the flow guidance element 16 might not be necessary.

In this embodiment of the invention, the area in which the climate control means is implemented is a switch cabinet 8 with different circuit elements 9 belonging to the wind turbine 2. In another embodiment, the invention could be implemented in any power transmission part of the wind turbine such as gear, electrical converter, generator, transformer or power electronics as well as in any structural part of the wind energy converter 1 such as the tower 3 or the nacelle 4.

The above described procedure of first heating and then cooling the air in an area of a wind turbine 2 can be repeated, until a satisfactory low level of humidity in the air has been achieved. Also, the climate control means can be used for heating all necessary parts of the wind energy converter 1 to an operational temperature e.g. with a range of 40-60° C., such as within 45-52° C. before it is started up as well as for cooling of the system during operation.

Figure 3:
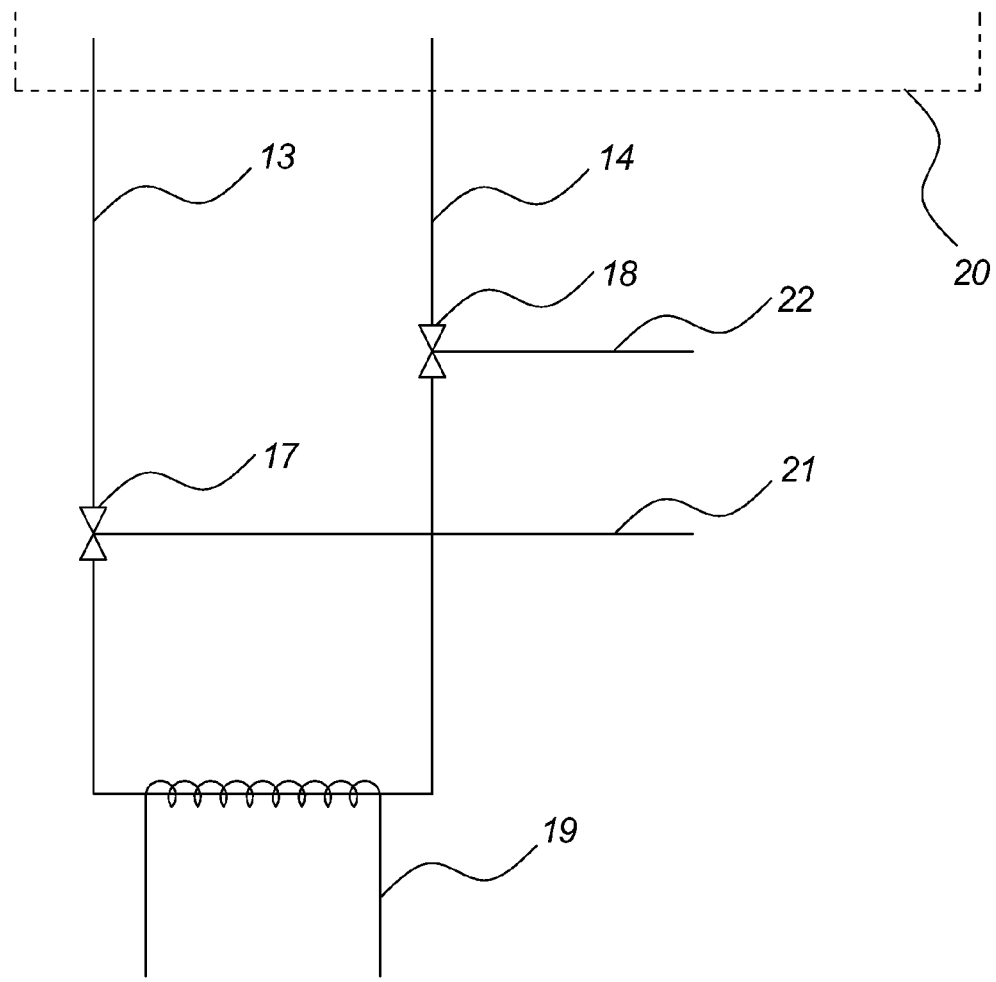
FIG. 3 illustrates a closed circuit for heating fluid combined with an open circuit for cooling fluid for a climate control device operable as dehumidifying and/or temperature control device.

FIG. 3 illustrates an embodiment of the invention in which a closed circuit for heating liquid and an open circuit for cooling liquid are connected to the inlet 13 and outlet 14 for cooling/heating fluid for a heat exchanger operating in a specific area 20 of a wind turbine 2.

An inlet valve 17 and an outlet valve 18 are used to switch between heating liquid and cooling liquid. When the valves 17, 18 are in one position, the heat exchanger is provided with heating liquid from the closed circuit which can be heated by an electrical heating device 19 when necessary. When the valves 17, 18 are in another position, the heat exchanger is provided with cooling liquid from the open circuit through the inlet for external cooling liquid 21 and drained through the outlet for external cooling liquid 22. Examples of external cooling liquids that could be used are ground water, sea water or a liquid from a closed circuit comprising a heat sink as described below with reference to FIG. 8.

In other embodiments of the invention the heating liquid can be heated by other means than electrical heating such as a flow of a warm heating liquid (e.g. from a heat storage as described below) through a heat exchanger.

Figure 4:
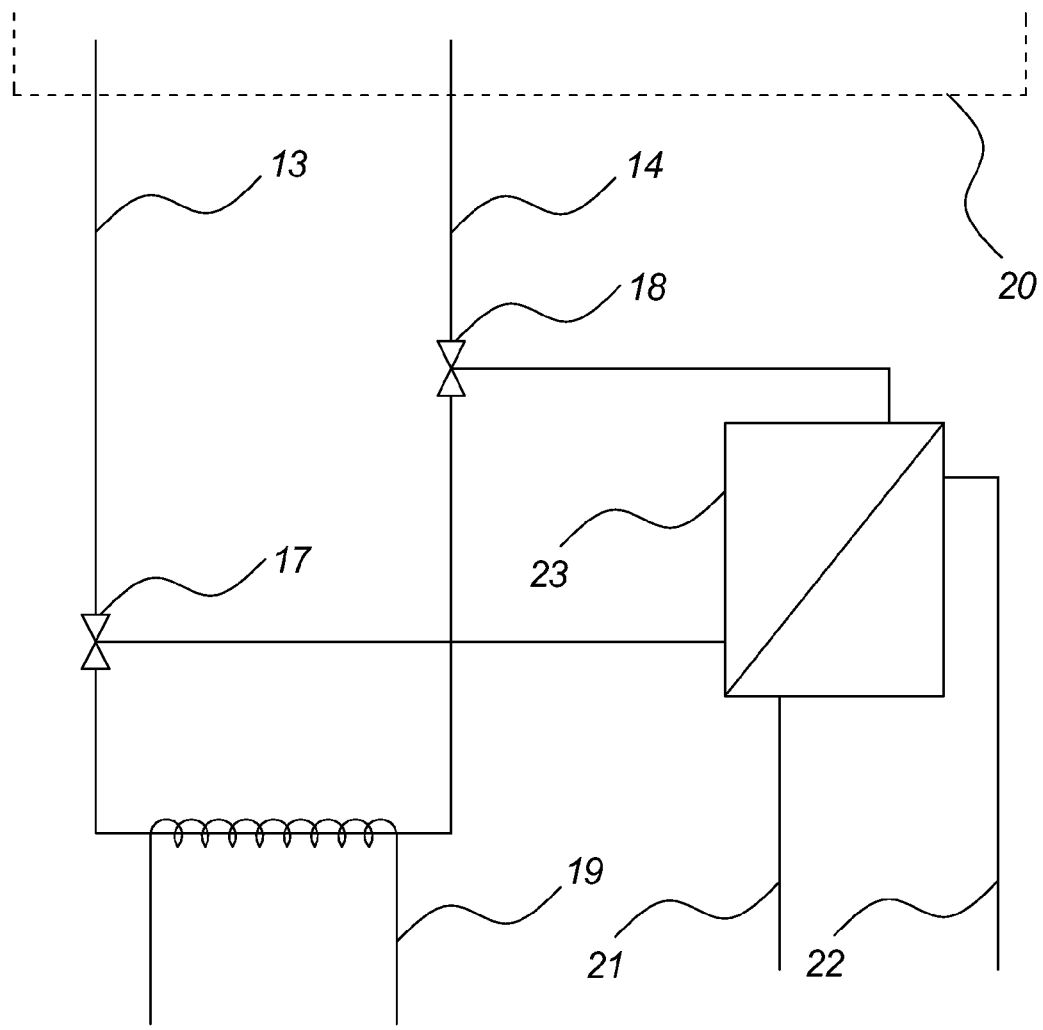
FIG. 4 illustrates a closed circuit for heating fluid combined with another closed circuit for cooling fluid for a climate control device operable as dehumidifying and/or temperature control device.

FIG. 4 illustrates an embodiment of the invention in which a closed circuit for heating liquid and another closed circuit for cooling liquid are connected to the inlet 13 and outlet 14 for cooling/heating fluid for a heat exchanger operating in a specific area 20 of a wind turbine 2.

An inlet valve 17 and an outlet valve 18 are used to switch between heating liquid and cooling liquid. When the valves 17, 18 are in one position, the heat exchanger is provided with heating liquid from the closed circuit which can be heated by an electrical heating device 19 when necessary. When the valves 17, 18 are in another position, the heat exchanger is provided with cooling liquid from the other closed circuit which can be cooled by a liquid-liquid heat exchanger 23. The external cooling liquid for the heat exchanger 23 is provided by the inlet for external cooling liquid 21 and drained through the outlet for external cooling liquid 22.

In other embodiments of the invention the heating liquid can be heated by other means than electrical heating such as one or more Peltier elements with liquid heat sinks and/or the cooling liquid can be cooled by other means than a liquid-liquid heat exchanger using an external cooling liquid.

Figure 5:
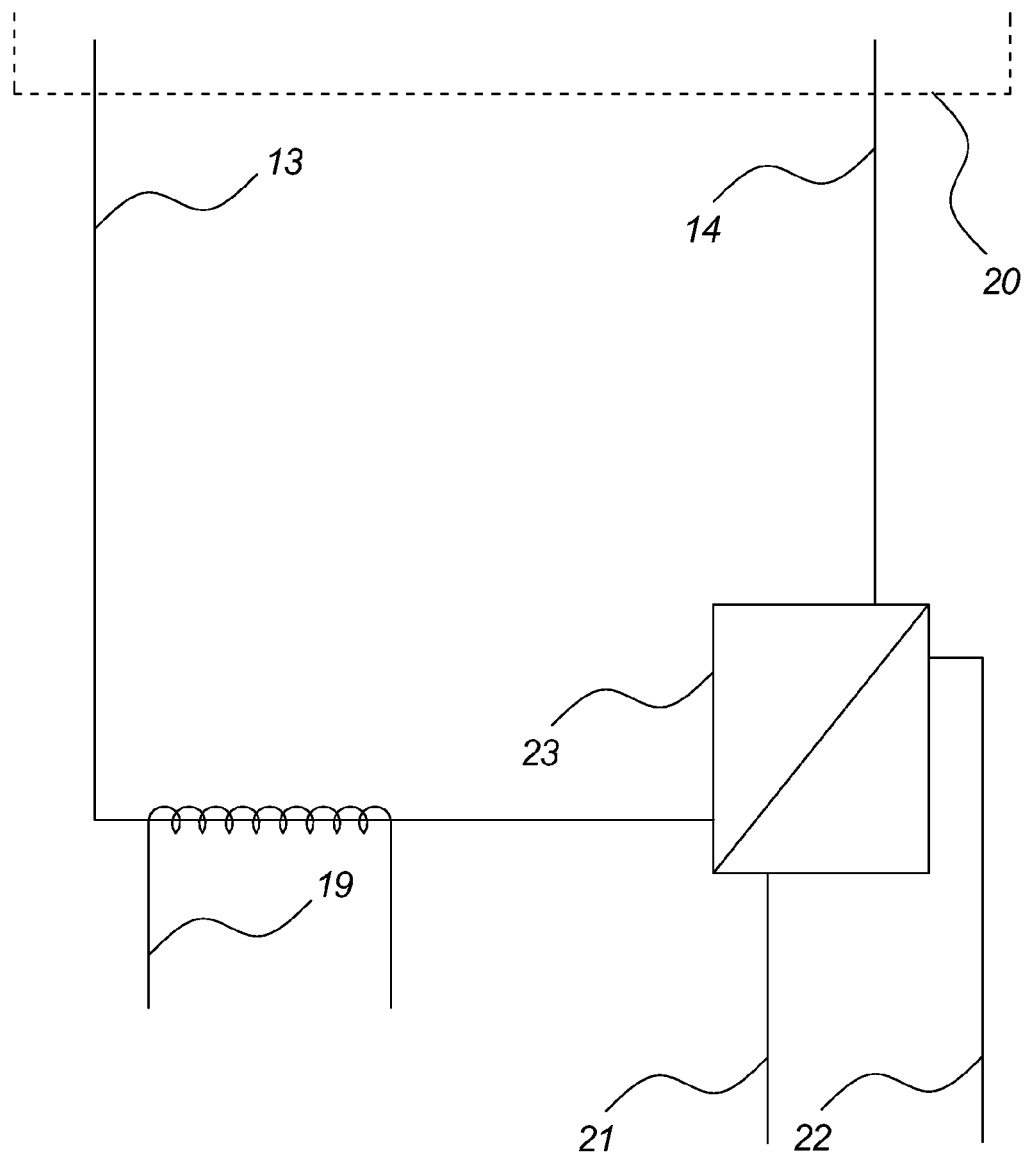
FIG. 5 illustrates a common closed circuit for heating fluid and cooling fluid for a climate control device operable as dehumidifying and/or temperature control device.

FIG. 5 illustrates an embodiment of the invention in which a common closed circuit for heating liquid and cooling liquid is connected to the inlet 13 and outlet 14 for cooling/heating fluid for a heat exchanger operating in a specific area 20 of a wind turbine 2.

The heat exchanger is provided with liquid from the closed circuit which can be heated by an electrical heating device 19 or cooled by a liquid-liquid heat exchanger 23. The external cooling liquid for the heat exchanger 23 is provided by the inlet for external cooling liquid 21 and drained through the outlet for external cooling liquid 22.

In other embodiments of the invention the heating liquid can be heated by other means than electrical heating and/or the cooling liquid can be cooled by other means than a liquid-liquid heat exchanger using an external cooling liquid as mentioned above. Also, in an embodiment of the invention the same heat exchanger 23 is used for heating as well as cooling the liquid flowing in the closed circuit by supplying either a warm or a cold liquid to the external side of the heat exchanger 23.

Figure 6:
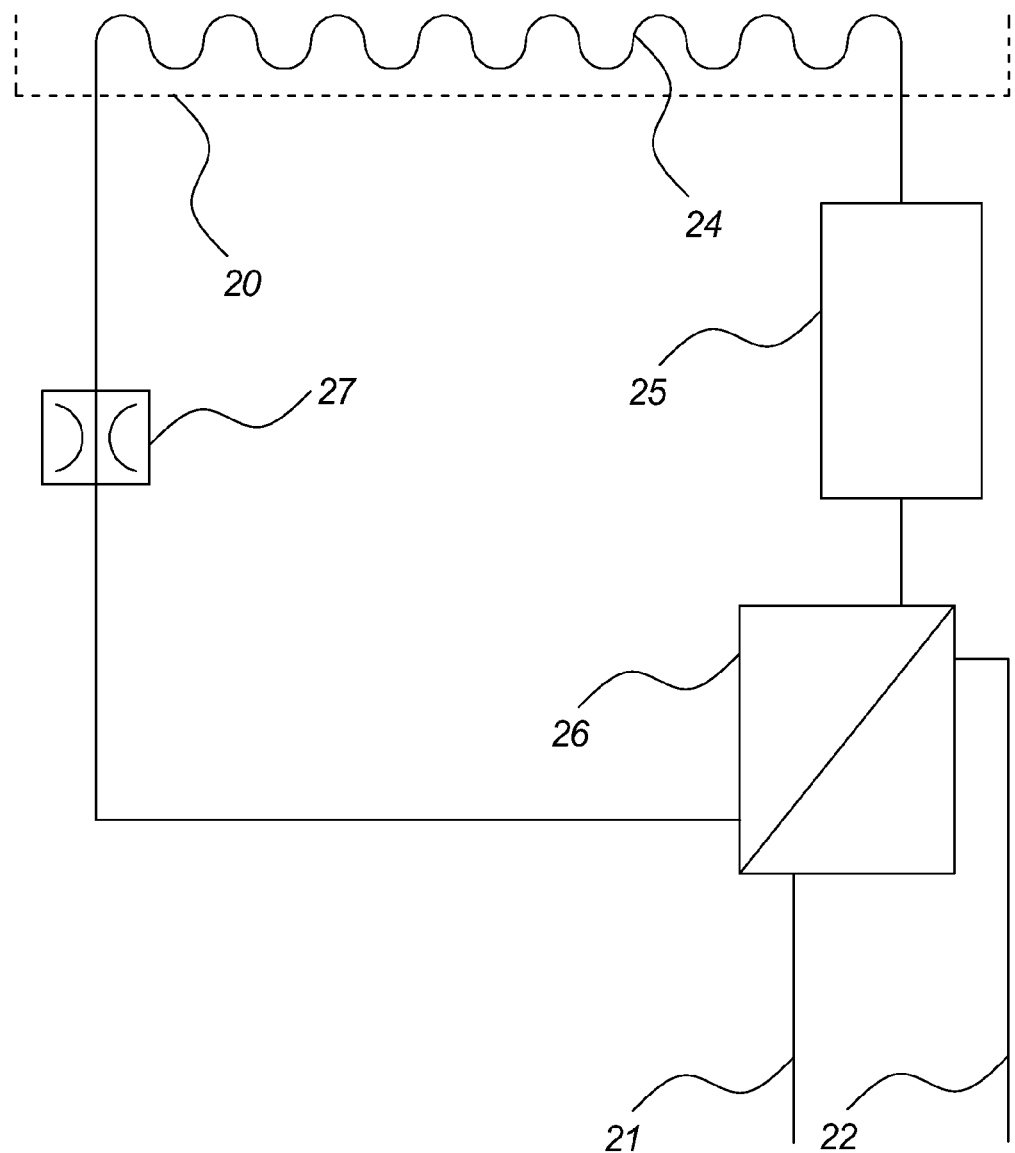
FIG. 6 illustrates a closed circuit for the fluid for a dehumidifying and/or temperature control device including an evaporator, a compressor, a condenser and a throttle valve.

FIG. 6 illustrates an embodiment of the invention in which a cooling circuit employing a cooling agent such as HFC, $CO_2$ or $NH_3$ is provided and the specific area 20 of a wind turbine 2 is cooled by a liquid-gas heat exchanger 24 in which the cooling agent is evaporated, thereby consuming heat energy which is taken from the air inside the area 20. Thus, the air in the specified area 20 is cooled.

After leaving the liquid-gas heat exchanger 24, the evaporated fluid is compressed in a compressor 25 and condensed in a liquid-liquid heat exchanger 26. Before re-entering the evaporator, the condensed fluid passes a throttle valve 27 in order to reduce its pressure.

In this embodiment the condenser is a liquid-liquid heat exchanger 26 cooled by an external cooling liquid provided by the inlet for external cooling liquid 21 and drained through the outlet for external cooling liquid 22.

The above described cooling principle is well-known from refrigerators and other cooling systems.

In another embodiment of the invention (not shown), the fluid circuit is provided with a number of valves making it possible to change the order in which the cooling agent passes the different elements of the circuit. In one configuration of the valves, the cooling agent passes the compressor 25 before it enters the specified area 20 of the wind turbine 2 and the throttle valve 27 after it leaves the specified area 20. In this case, the liquid-gas heat exchanger 24 works as a condenser releasing heat energy from the cooling agent, thus heating the air inside the specified area 20 of the wind turbine 2, and the liquid-liquid heat exchanger 26 works as an evaporator being provided with an external heating liquid instead of a cooling liquid. Thus, the system can be used for heating as well as for cooling the specified area 20 of the wind turbine 2.

Figure 7:
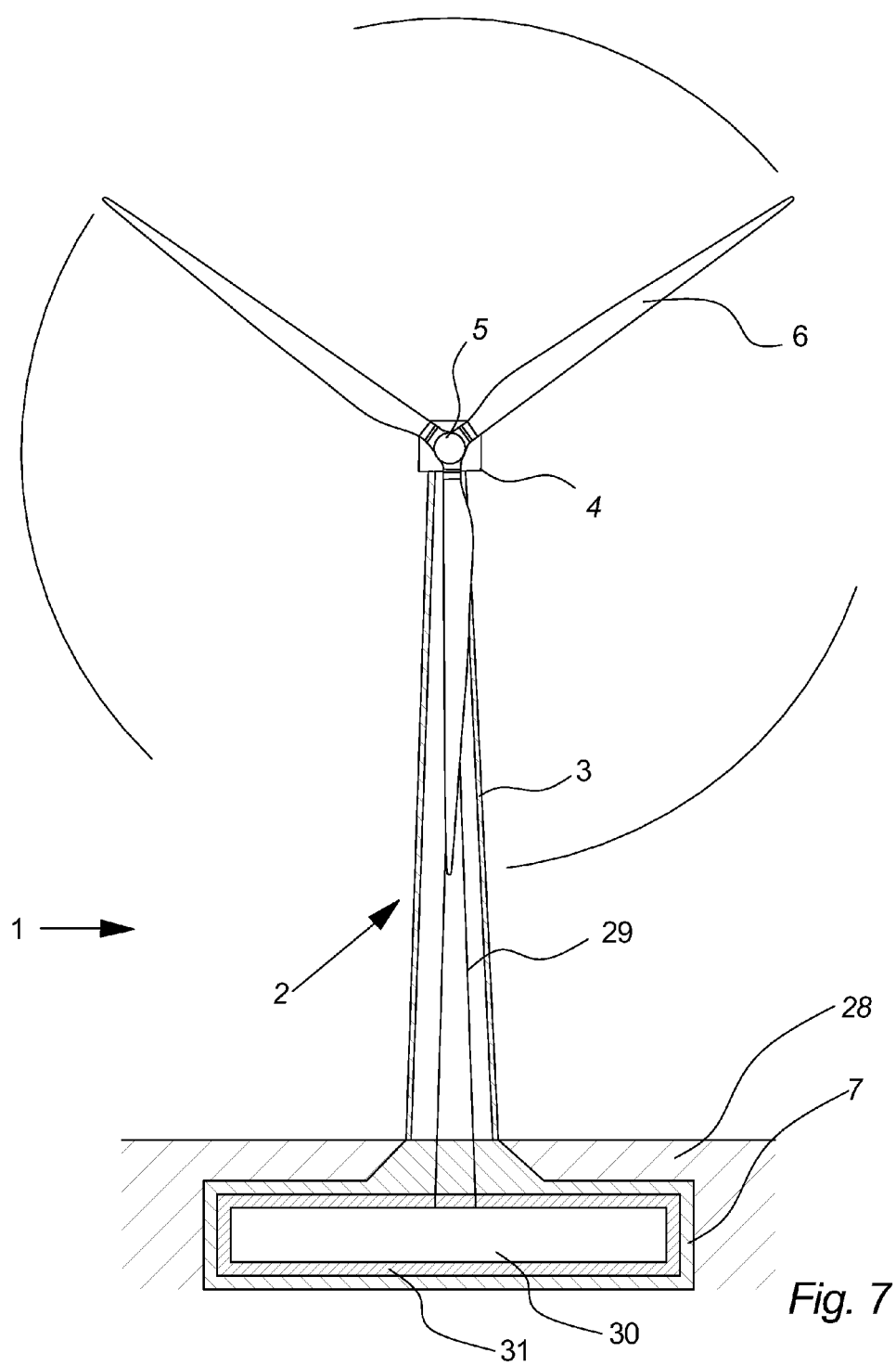
FIG. 7 illustrates a cross section of a wind energy converter comprising a heat storage implemented in its foundation, as seen from the front.

FIG. 7 illustrates a cross section of an embodiment of a wind energy converter 1 according to the invention comprising a foundation 7 which contains a thermally insulated liquid tank 30 acting as a heat storage for the climate control means, as seen from the front.

In this embodiment of the invention the wind energy converter 1 comprises a wind turbine 2 placed on a wind turbine foundation 7. The foundation 7 in this embodiment is placed in the ground or sea bed 28 and substantially made at the site of concrete reinforced by a strengthening structure, but in another embodiment the foundation 7 could be completely or partly prefabricated e.g. in the form of one or more metal or concrete shells or structures which e.g. could be filled at the site with a filler such as concrete, stones, sand or other.

The heat storage comprises a liquid tank 30 which is thermally insulated by a layer of insulating material 31 more or less completely surrounding the tank. The liquid tank is connected to the climate control means in the nacelle 4 by fluid conduits 29. Cooling liquid that has been heated in the climate control means is transported to the heat storage in the foundation 7 from where it can subsequently be returned to the climate control means to be used as a heating liquid. Thus, excess heat energy which is removed from one or more specific areas 20 of the wind energy converter 1 and otherwise would be lost can be reused.

In this embodiment of the invention the climate control means controls the temperatures of or the humidity around specific components in the nacelle 4, but in another embodiment the climate control means could also or instead control the temperature or humidity of the entire nacelle 4 including the air inside the nacelle, it could control the temperature or humidity of components in the tower 3 and/or of the air in the tower, it could control the temperature or humidity of specific components of the rotor 5 e.g. to maintain the blades 6 frost-free, it could control the temperature or humidity of wind turbine components placed outside the wind turbine e.g. in a neighboring house (not shown) and/or the temperature or humidity inside said house or any combination hereof.

Figure 8:
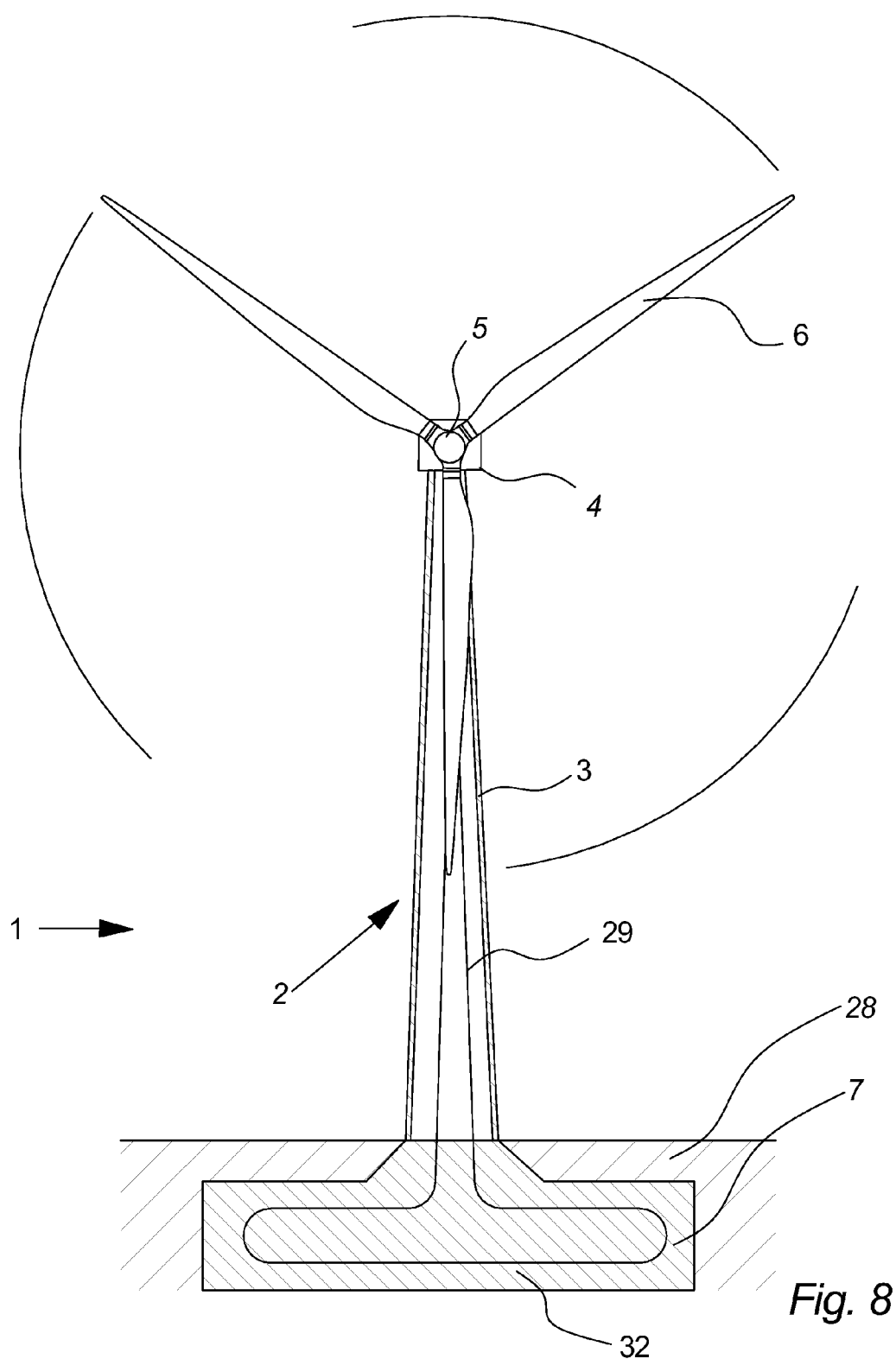
FIG. 8 illustrates a cross section of a wind energy converter comprising a cold storage implemented in its foundation, as seen from the front.

FIG. 8 illustrates a cross section of an embodiment of a wind energy converter 1 according to the invention comprising a foundation 7 acting as a heat sink 32 of the climate control means, as seen from the front.

In this embodiment of the invention the wind energy converter 1 comprises a wind turbine 2 and a wind turbine foundation 7 placed in the ground or sea bed 28. The foundation 7 in this embodiment is substantially made at the site of concrete reinforced by a strengthening structure, but in another embodiment the foundation 7 could be completely or partly prefabricated e.g. in the form of one or more metal or concrete shells or structures which e.g. could be filled at the site with a filler such as concrete, stones, sand or other.

In this embodiment the climate control means comprises a closed fluid conduit 29 running from the nacelle 4, down through the tower 3, into the foundation 7 before it returns to the nacelle 4. In FIG. 9, the routing of the fluid conduit 29 in the nacelle 4, tower 3 and in the foundation 7 is somewhat simplified and in another embodiment the fluid conduit 29 would e.g. describe a more complex pattern in the foundation 7 before returning to the wind turbine 2.

In another embodiment of the invention the climate control means could also comprise an open flow of cooling fluids e.g. if the foundation 7 comprised a reservoir (not shown) whereto the cooling fluids where pumped e.g. from the nacelle 4 and wherefrom the cooling fluids where pumped into the wind turbine 2 but in a preferred embodiment of the invention the cooling fluids of the climate control means circulates in a closed circuit.

In the illustrated closed circuit the cooling fluid is brine but in another embodiment of the invention the cooling fluid could be another kind of anti-freeze and water solution, such as water and isopropyl alcohol. The cooling fluid could also be any other kind anti-freeze solution, such as methanol, propylene glycol or potassium acetate or it could be ammonia, $CO_2$ and/or fluorocarbon refrigerants.

In this embodiment of the invention the climate control means controls the temperatures of or humidity around specific components in the nacelle 4, but in another embodiment the climate control means could also or instead control the temperature and humidity of the entire nacelle 4 including the air inside the nacelle, it could control the temperature and humidity of components in the tower 3 and/or of the air in the tower, it could control the temperature and humidity of specific components of the rotor 5 e.g. to maintain the blades 6 frost-free, it could control the temperature and humidity of wind turbine components placed outside the wind turbine e.g. in a neighboring house (not shown) and/or the temperature inside said house or any combination hereof.

In another embodiment of the invention at least a part of the climate control means being located in the foundation 7 could also be formed as one or more heat-pipes (not shown). In their simplest forms heat-pipes comprise a sealed vessel containing a working fluid and its vapour, together with a capillary wick lining system. A heat-pipe is basically a very efficient super heat conductor, which provides a thermal absorption and transfer system with the capability to move large amounts of power in the form of heat energy.

The application of heat at any point on the heat-pipe surface causes a liquid/vapour phase change inside, which enables heat energy to be transmitted in the vapour phase with only a minimal temperature gradient. In terms of thermal conductivity, a heat-pipe can exhibit a thermal performance which can exceed that of an equivalent sized component made from pure copper by over 1000 times.

Typically, heat-pipes are produced in rod form with a circular cross section but other shapes are also possible such as other cross sections or flattened section heat-pipes.

What is claimed is:

1. A wind energy converter comprising
   a wind turbine; and
   a climate control mechanism for separating and removing humidity from air within one or more areas of said wind turbine, comprising at least one heating device and at least one cooling device;
   wherein said heating device heats up the air within said one or more areas of said wind turbine and said cooling device cools the heated air such that the humidity in the air is condensed within said one or more areas of the wind turbine, and wherein said wind energy converter further comprises at least one drain device for draining condensed water from said one or more areas being dehumidified and a cooling flow device for providing a flow of a cooling liquid to the at least one cooling device, thereby providing a heat sink for said cooling device.

2. The wind energy converter according to claim 1, wherein said climate control mechanism further comprises one or more closed circuits for circulating cooling liquid through or past the cooling device and a device for cooling said cooling liquid.

3. The wind energy converter according to claim 2, wherein said cooling liquid comprises at least one of an anti-freeze and water solution, methanol, isopropyl alcohol, propylene glycol, ammonia, $CO_2$, fluorocarbon refrigerants and potassium acetate.

4. The wind energy converter according to claim 2, wherein said device for cooling the cooling liquid comprises a liquid-liquid heat exchanger arranged to employ a source of cooling water external to the wind energy converter to exchange heat with the cooling liquid.

5. The wind energy converter according to claim 2, further comprising a wind turbine foundation, wherein said device for cooling the cooling liquid comprises a heat dissipation arrangement inside the wind turbine foundation, in the ground or seabed underneath the wind turbine foundation, or both inside the wind turbine foundation and in the ground or seabed underneath the wind turbine foundation.

6. The wind energy converter according to claim 2, further comprising a wind turbine foundation, wherein said device for cooling the cooling liquid comprises a heat dissipation arrangement in the ground, or in the sea, the seabed outside the wind turbine foundation or both the sea and the seabed.

7. The wind energy converter according to claim 1, wherein said climate control mechanism further comprises one or more open circuits for providing said flow of cooling liquid.

8. The wind energy converter according to claim 7, wherein said cooling liquid is supplied from a source of cooling water external to the wind energy converter.

9. The wind energy converter according to claim 1, comprising a heat storage and a device for selectively transferring excess heat energy from one or more power transmission parts of the wind turbine to said heat storage and storing said heat energy therein and for retrieving heat energy therefrom for subsequent use with said climate control device.

10. The wind energy converter according to claim 9, further comprising a wind turbine foundation, wherein said heat storage is arranged inside the wind turbine foundation, in the ground or seabed underneath the wind turbine foundation, or both inside the wind turbine foundation and in the ground or seabed underneath the wind turbine foundation.

11. The wind energy converter according to claim 9, further comprising a wind turbine foundation, wherein said heat storage is arranged in the ground or seabed outside the wind turbine foundation.

12. The wind energy converter according to claim 1, wherein said climate control mechanism comprises at least one physical element configured to be operable as the heating device as well as the cooling device.

13. The wind energy converter according to claim 12, wherein said heating device is heated by a heating fluid circulating in one or more closed circuits through or past the heating device.

14. The wind energy converter according to claim 12, comprising a common flow path within said climate control mechanism for selectively allowing said flow of a cooling liquid and said flow of a heating fluid to exchange heat with the air within said one or more areas of the wind turbine.

15. The wind energy converter according to claim 1, wherein the cooling device comprises a closed cooling circuit of a cooling agent, the circuit comprising an evaporator arranged for evaporating the cooling agent by thermal exchange with the air of said one or more areas of the wind turbine, a pressurizer for pressurizing the evaporated cooling agent and a condenser for condensing the pressurized cooling agent by thermal exchange with the cooling liquid.

16. The wind energy converter according to claim 15, wherein said closed cooling circuit is arranged for selective arrangement of the operation thereof to constitute a heating device for heating the air within said one or more areas of said wind turbine, wherein said evaporator operates as a condenser.

17. The wind energy converter according to claim 1, comprising a controller for controlling the operation of the climate control mechanism at start-up of the wind energy converter, wherein the heating device is operated to heat said one or more areas of said wind turbine to a predefined operating temperature, and the climate control mechanism is operated as a dehumidifier for separating and removing humidity from the air within said one or more areas of the wind turbine.

18. The wind energy converter according to claim 17, comprising one or more humidity sensors arranged within said one or more areas of said wind turbine for detecting and measuring of the humidity and providing an output to the controller, wherein the controller operates the heating device, and the climate control mechanism operates as the dehumidifier in response to said output.

19. The wind energy converter according to claim 18, wherein one or more humidity sensors are arranged adjacent to one or more power switches of an electrical power converter for providing power of predefined frequency.

20. The wind energy converter according to claim 19, wherein one or more humidity sensors are arranged to measure the humidity of a moisture-absorbing material surrounding the one or more power switches.

21. The wind energy converter according to claim 17, wherein the controller is arranged to alternately operate the heating device and the climate control mechanism operated as the dehumidifier in repeated cycles.

22. The wind energy converter according to claim 1, further comprising a wind turbine foundation, wherein one or more parts of said climate control device is located in at least one of a nacelle, blades, a tower, and the wind turbine foundation or anywhere else inside or immediately outside the wind energy converter.

23. The wind energy converter according to claim 1, wherein said climate control mechanism operates configured to be operable as well as dehumidifying means as temperature control means.

24. A method for dehumidification of one or more areas of a wind energy converter, comprising the steps of:

heating the one or more areas of the wind energy converter by at least one heating device, cooling the air in said one or more areas of the wind energy converter by at least one cooling device such that the humidity in the air is condensed, draining the condensed water from the one or more areas of the wind energy converter by a draining device; and providing a heat sink for said at least one cooling device comprising cooling flow device that provides a flow of cooling liquid to the cooling device.

25. The method according to claim 24, wherein the same physical element is used first for heating the air and for cooling the air and condensing the humidity in the air.

26. The method according to claim 24, wherein the air in said one or more areas of a wind energy converter is first heated until it reaches a predefined temperature by providing a flow of a heating liquid through a liquid-gas heat exchanger through which the air is brought to flow, and then the humidity in the heated air is condensed by providing a flow of a cooling liquid through said liquid-gas heat exchanger.

27. The method according to claim 26, wherein same fluid conduits are used for providing the flow of the heating fluid and the flow of the cooling liquid through said liquid-gas heat exchanger.

28. The method according to claim 24, wherein the steps of heating the air using a heating fluid and condensing the moisture in the air using the cooling liquid are repeated until a satisfactory low level of humidity in the air is achieved.

29. The method according to claim 24, wherein the steps of heating the air using said at least one heating device and condensing the moisture in the air using the cooling device are performed during a start-up of the wind energy converter.

* * * * *